US010637596B2

(12) United States Patent
Jeffs et al.

(10) Patent No.: US 10,637,596 B2
(45) Date of Patent: Apr. 28, 2020

(54) SYSTEMS AND METHODS FOR FRICTIONLESS AUDIO-FADER POSITION MEASUREMENT

(71) Applicant: inMusic Brands, Inc., Cumberland, RI (US)

(72) Inventors: Philip R. Jeffs, Snohomish, WA (US); John O'Donnell, Ft. Lauderdale, FL (US); Colin Tracy Isler, Seattle, WA (US); Tim B. Freedman, Everett, WA (US)

(73) Assignee: INMUSIC BRANDS, INC., Cumberland, RI (US)

( * ) Notice: Subject to any disclaimer, the term of this patent is extended or adjusted under 35 U.S.C. 154(b) by 0 days.

(21) Appl. No.: 16/359,297

(22) Filed: Mar. 20, 2019

(65) Prior Publication Data

US 2019/0296843 A1  Sep. 26, 2019

Related U.S. Application Data

(60) Provisional application No. 62/645,713, filed on Mar. 20, 2018.

(51) Int. Cl.
| | |
|---|---|
| *H04H 60/04* | (2008.01) |
| *H04H 60/58* | (2008.01) |
| *H02K 41/00* | (2006.01) |
| *G01R 33/07* | (2006.01) |

(52) U.S. Cl.
CPC ............ *H04H 60/04* (2013.01); *H04H 60/58* (2013.01); *G01R 33/07* (2013.01); *G01R 33/072* (2013.01); *H02K 41/00* (2013.01); *H04R 2430/01* (2013.01)

(58) Field of Classification Search
CPC .... H04H 60/04; H04H 60/58; H04R 2430/01; G01R 33/07; G01R 33/072; H02K 41/00
See application file for complete search history.

(56) References Cited

U.S. PATENT DOCUMENTS

| | | | |
|---|---|---|---|
| 6,813,361 B1* | 11/2004 | Jeffs ................. | H04H 60/04 369/4 |
| 10,374,733 B2* | 8/2019 | Anderson ............. | G01D 5/20 |
| 2007/0002488 A1* | 1/2007 | Kato .................... | G01D 5/2451 360/85 |
| 2009/0033317 A1* | 2/2009 | Hayashi ............... | G01B 7/003 324/207.21 |

* cited by examiner

*Primary Examiner* — Andrew L Sniezek
(74) *Attorney, Agent, or Firm* — Burns & Levinson LLP (57) ABSTRACT

Disclosed embodiments provide systems and methods related to measuring a frictionless audio-fader position. A frictionless audio-fader position measuring system comprises a control slider, a sensing magnet, at least two magnetic flux sensors configured to output at least one of a voltage or a current based on the position of the sensing magnet and, a processor wherein the processor calculates a correlation between the position of the sensing magnet and a phase angle between the outputs of at least two of the magnetic flux sensors to determine a position of the sensing magnet, wherein the determined position of the sensing magnet controls an amplifier, mixer, and/or other hardware or software component.

20 Claims, 13 Drawing Sheets

SYSTEMS AND METHODS FOR FRICTIONLESS AUDIO-FADER POSITION MEASUREMENT

PRIORITY

This application claims priority to U.S. Provisional Application No. 62/645,713 filed Mar. 20, 2018, the disclosure of which is hereby incorporated by reference in its entirety.

TECHNICAL FIELD

The present disclosure generally relates to apparatus, systems and methods for frictionless audio-fader position measurement.

The following detailed descriptions are exemplary and explanatory only, and the invention is not limited to these illustrative embodiments.

BACKGROUND

Several methods for determining linear position for audio-fader control have been used. One method is using linear contact. While inexpensive, controls using linear contact method suffer from very poor wear and high drag force by using plastic or carbon resistive elements. A second method uses an inductive component. By using the physical principles of induction in a wire, eddy currents detect the position of an electrically conducting target that is sliding or rotating above a set of coils, consisting of one transmitter coil and two receiver coils. Controls using inductive components provide good linearity and resolution but also require careful calibration. A third method is using on-axis magnetic field, such as described in U.S. Pat. No. 6,813,361. Controls using on-axis magnetic field suffer not only from limited resolution, travel, and linearity, but also are sensitive to mechanical tolerance, magnet strength, Hall sensor offset, and Hall sensor sensitivity. A fourth method is uses optical components. These controls require relatively complex optics and digital pickups have limited resolution and suffer from poor repeatability because of highly sensitive component and mechanical tolerance.

Therefore, there is a need for improved methods and systems for improving fader position measurement.

SUMMARY

One illustrative aspect of the present disclosure is directed to a system for frictionless audio-fader position measurement. The system for frictionless audio-fader position measurement may include a control slider and a sensing magnet. The system may further include a processor. The processor receives sinusoidal outputs from the magnetic flux sensors and calculates a correlation between the position of the sensing magnet and a phase angle between the outputs of at least two of the magnetic flux sensors.

Another illustrative aspect of the present disclosure is directed to a non-transitory computer-readable medium for storing instructions executable by a processor to measure a position of a sensing magnet in a carrier according to a method. The method comprises receiving sinusoid outputs from at least two magnetic flux sensors and calculating a correlation between the position of the sensing magnet and a phase angle between the outputs of the magnetic flux sensors.

The invention is not limited to the foregoing illustrative embodiments and other systems, methods, and devices are also disclosed herein.

DETAILED DESCRIPTION

Reference will now be made to certain embodiments consistent with the present disclosure, examples of which are illustrated in the accompanying drawings. Wherever possible, the same reference numbers will be used throughout the drawings to refer to same or like parts.

The present disclosure describes apparatus, systems and methods for a frictionless audio-fader control position measurement. FIGS. 1-4 show one illustrative embodiment of an audio-fader control ("fader 100") consistent with the present invention. Fader 100 may be a crossfader, such as a crossfader used in a disk jockey (DJ) audio mixer, a channel fader in an audio mixer, or any other type of control for adjusting various audio levels or parameters in which the linear position of a control (e.g., fader, switch, slider, paddle, etc.) is used to adjust an audio level or parameter. Fader 100 provides improved resolution, precision, and accuracy in its determination of a carrier's position. The carrier 106, discussed below in more detail, is coupled to a control slider 101. The control slider 101 is moved by a user to move the carrier 106 and thereby control an amplifier, mixer, and/or other hardware or software component. The resolution of fader 100 may be the smallest carrier-position deviation the system may detect from one or more locations or range of locations. The precision of fader 100 may be a measure of the error within which a given carrier-position reading can be reproduced by the system. The accuracy of fader 100 may measure the difference between the carrier-position measurement and the actual carrier 106 position.

The control slider 101 allows a user to move the carrier 106 over its range of travel. Different users may want different amounts of force to be required to move the carrier 106. This force may be referred to as fader's 100 drag or resistance. Turntablists using fader 100 as a crossfader may want very little drag because their performance may require them to move fader 100 very quickly and change the direction of movement very quickly. Live-sound audio engineers using fader 100 as a channel fader, however, may want more drag because they may want to avoid sudden changes in channel volume that could occur if someone's sleeve inadvertently brushes against a fader 100. Having sufficient drag may prevent such occurrences.

The drag may be adjusted using a drag force adjustment element 102. The drag force adjustment element 102 may be a screw. This element 102 may move a drag magnet 103 closer to or further from the main shaft 104. The closer the drag magnet 103 is to the main shaft 104, the more force it applies to a bearing 107 that reduces friction between the carrier 106 and the shaft 104. The more force applied to the bearing 107 by the drag magnet 103, the higher the force required to move the carrier 106. In one exemplary embodiment, the drag may be adjusted from about 7 g-f to about 30 g-f. For example, if fader 100 is used as a crossfader, the drag may be set from about 7 gf to about 10 gf. If fader 100 is used as a channel fader, the drag force may be set from about 25 gf to about 30 gf. In another embodiment, the drag may be adjusted from about 0 g-f to about 100 g-f.

The main shaft 104 may be metallic. For example, the main shaft 104 may comprise 400 series stainless steel. The main shaft 104 may be corrosion resistant and rigid. The main shaft 104 may have the magnetic properties necessary for there to be sufficient magnetic attraction between the main shaft 104 and the drag magnet 103. One or more materials with higher iron contents may be selected for the main shaft 104 to increase the magnetic attraction between the main shaft 104 and the drag magnet 103. A secondary shaft 105 may be metallic. For example, the secondary shaft 105 may comprise 300 series stainless steel. Secondary shaft 105 may comprise a material with an iron content that will not substantially affect the flux distribution of the sensing magnet 108, discussed in more detail below. In some embodiments, the main shaft 104 and/or the secondary shaft 105 may have a bright-mirror finish to decrease friction between the shaft and the bearing 107. This decreased friction may be desirable to a user. For example, the user may have more precise control over the carrier 106 if the amount of force necessary to move the control slider 101 is constant across its full travel length. The bright-mirror finish may increase the longevity of the shafts by preventing groves from forming in the material that will affect force necessary to move the carrier 106.

Figure 3:
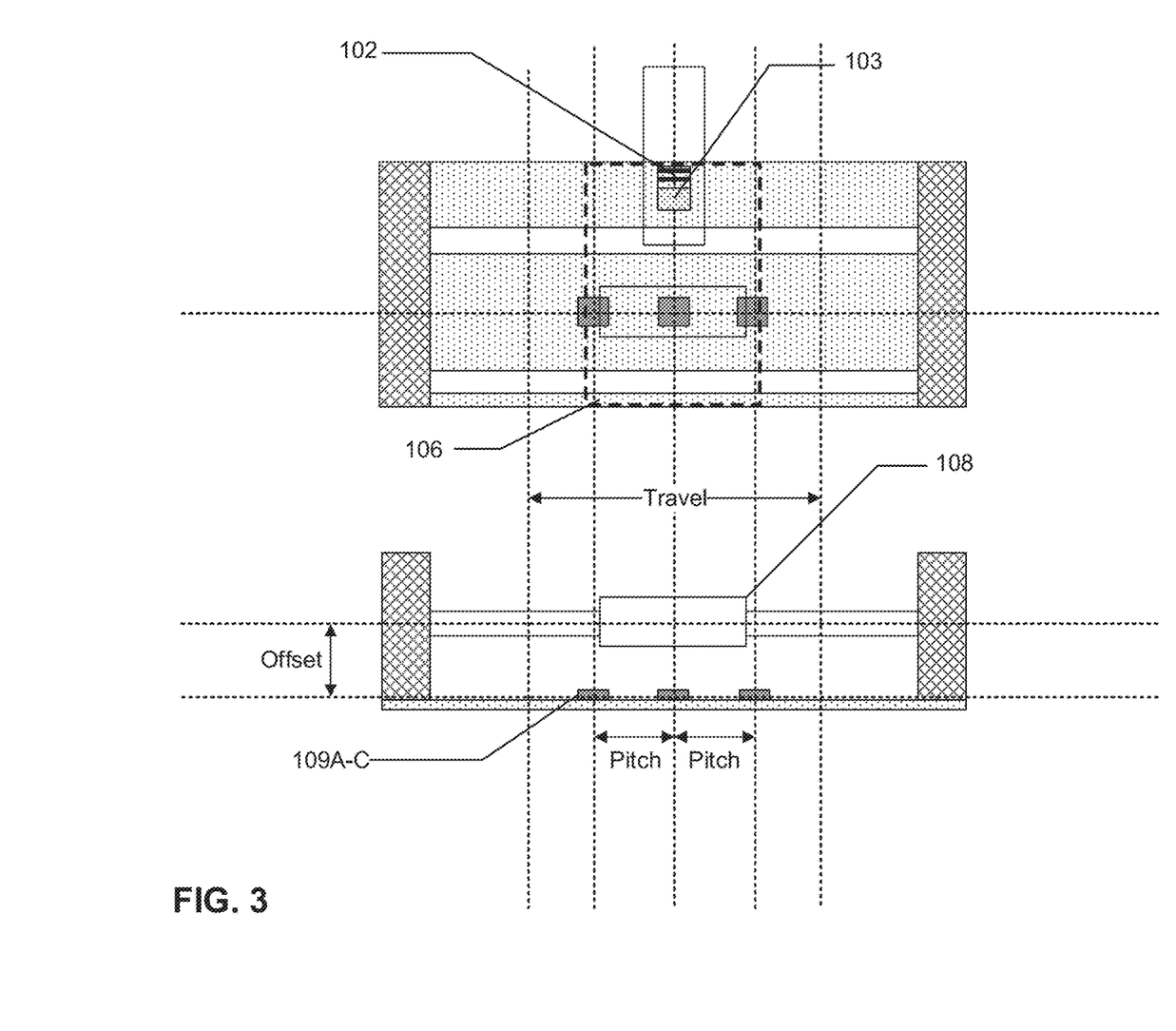
FIG. 3 shows a schematic side view and a schematic top view of the audio-fader control of FIG. 1.
Figure 4:
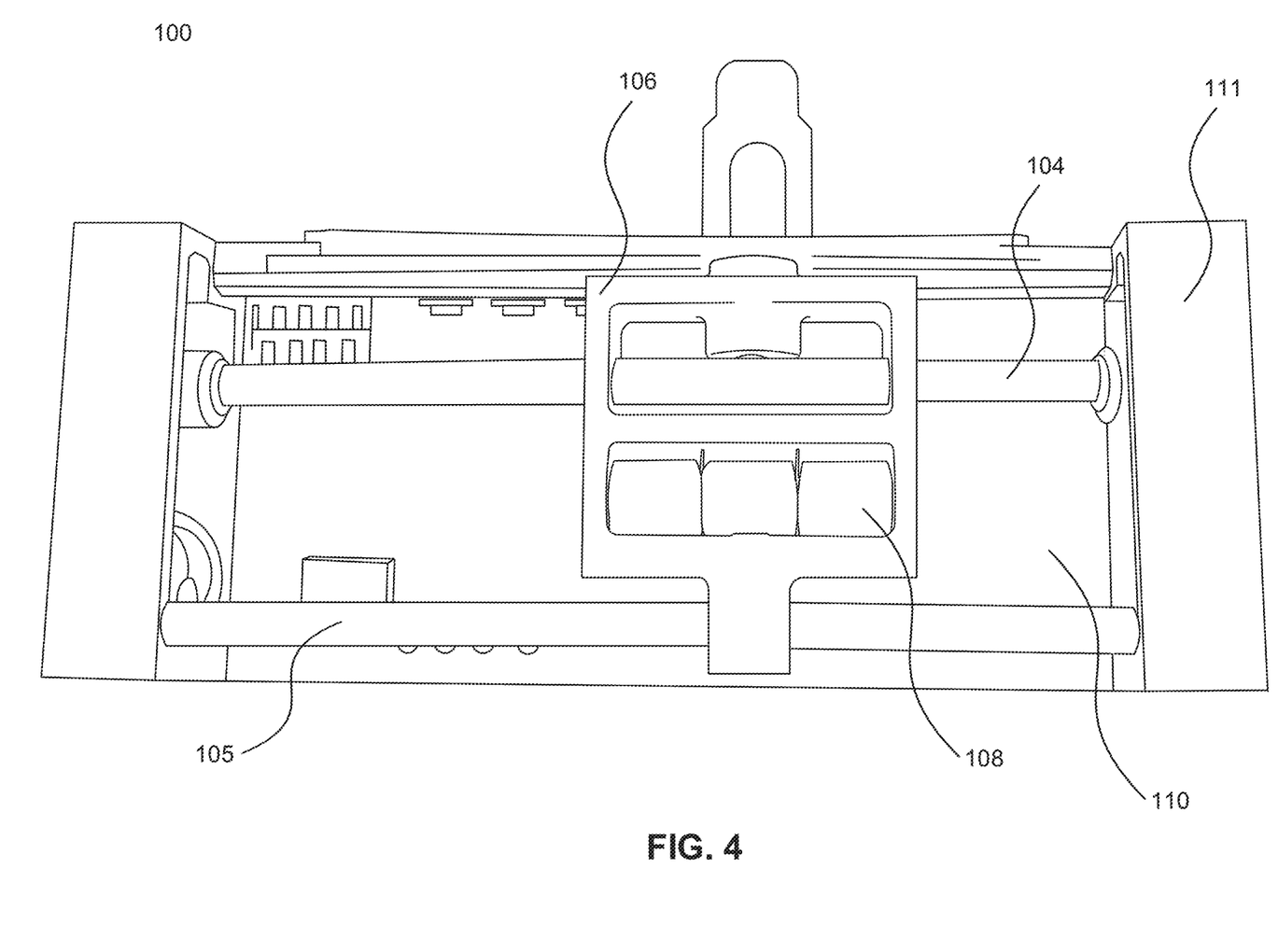
FIG. 4 shows a side view of the audio-fader control of FIG. 1.

The carrier 106 may comprise a plastic alloy. Bearing inserts 107 (i.e., "bearings") may be within or outside the carrier 106 and may decrease friction between the carrier 106 and the main shaft 104. In some embodiments, the bearings 107 may be designed to provide a tighter fit between the carrier 106 and the main shaft 104. In some embodiments, one or more bearings 104 may be configured to decrease friction between the carrier 106 and the secondary shaft 105. The secondary shaft 105 may prevent the carrier 106 from rotating about the main shaft 104 if a force is applied on the control slider 101 in a direction perpendicular to the carrier's 106 direction of travel. The carrier 106 may contain the sensing magnet 108, allowing the sensing magnet 108 to be moved over at least a portion of the range of travel while maintaining a fixed distance above the plane of one or more magnetic flux sensors 109A-C. The sensors 109A-C may be mounted on a PC Board 110. In some embodiments, as shown in FIG. 3, the sensors 109A-C may be mounted at a particular distance from one another (i.e., a "pitch"). PC Board 110 may contain circuitry that processes the sensor outputs. End blocks 111 may be attached to the PC Board Assembly 110, the main shaft 104, and/or the secondary shaft 105. End blocks 111 may keep some, none, or all of these components at a fixed distance from the sensors 109A-C (i.e., "Offset"). Rubber stops 112 may be used on the main shaft 104 and/or secondary shaft 105 to cushion the impact between the carrier 106 and the end block 111 at the ends of the travel range.

A user may calibrate fader 100. For example, a user may perform cut-in calibration on fader 100. Cut-in calibration sets the position of the carrier at which the user desires audio to be gated (e.g., silenced or attenuated). For example, the user may move the carrier 106 to a "cut-in position" by sliding the control slider 101 and press a button on a mixer housing to set a cut-in position. In some embodiments, after this calibration, audio may be silenced or attenuated when the carrier is positioned on a first side of the cut-in position and audible at full volume or at a reduced volume when the carrier 106 is positioned to the opposite of the cut-in position. In some embodiments, the user may select which side of the cut-in position the carrier 106 may be moved to in order to silence or attenuate the audio and which side to make the audio audible. In other embodiments a user may select whether the audio is audible at full volume or at a lower volume when the carrier 106 is on one side of the cut-in position. In further embodiments, a user may select whether the audio is silent or attenuated with the carrier 106 on the opposite side of the cut-in position.

To increase resolution, precision, and accuracy of the position-measuring system, it is desirable to sense the position of the carrier 106 without establishing contact between the carrier 106 and the measuring device. Resolution, precision, and accuracy may be increased with contactless sensing by virtue of there being no mechanical wear in the interface between the carrier 106 and the sensors. To accomplish non-contact sensing, one or more magnetic flux sensors 109A-C may be used to sense the position of the sensing magnet 108 in the carrier 106. As discussed above, the magnetic flux sensors 109A-C may be Hall effect sensors ("sensors").

The sensors 109A-C may be positioned in such a way so as to exploit the sinusoidal nature of the sensor output that occurs when the sensing magnet 108 slides by the sensor. By positioning the sensors 109A-C such that one sensor 109A outputs a sinusoid that is 90 degrees out of phase from the sinusoid outputted by an adjacent sensor 109B when the sensing magnet 108 slides by, the two sinusoids may be used to compute the position of the sensing magnet 108 and, therefore, the carrier 106. To do this, a linear relationship may be established between the position of the sensing magnet 108 and a combination of outputs from the sensors

109A-C. This correlation may be used to determine the position of the sensing magnet 108 from the outputs of the sensors.

Figure 5:
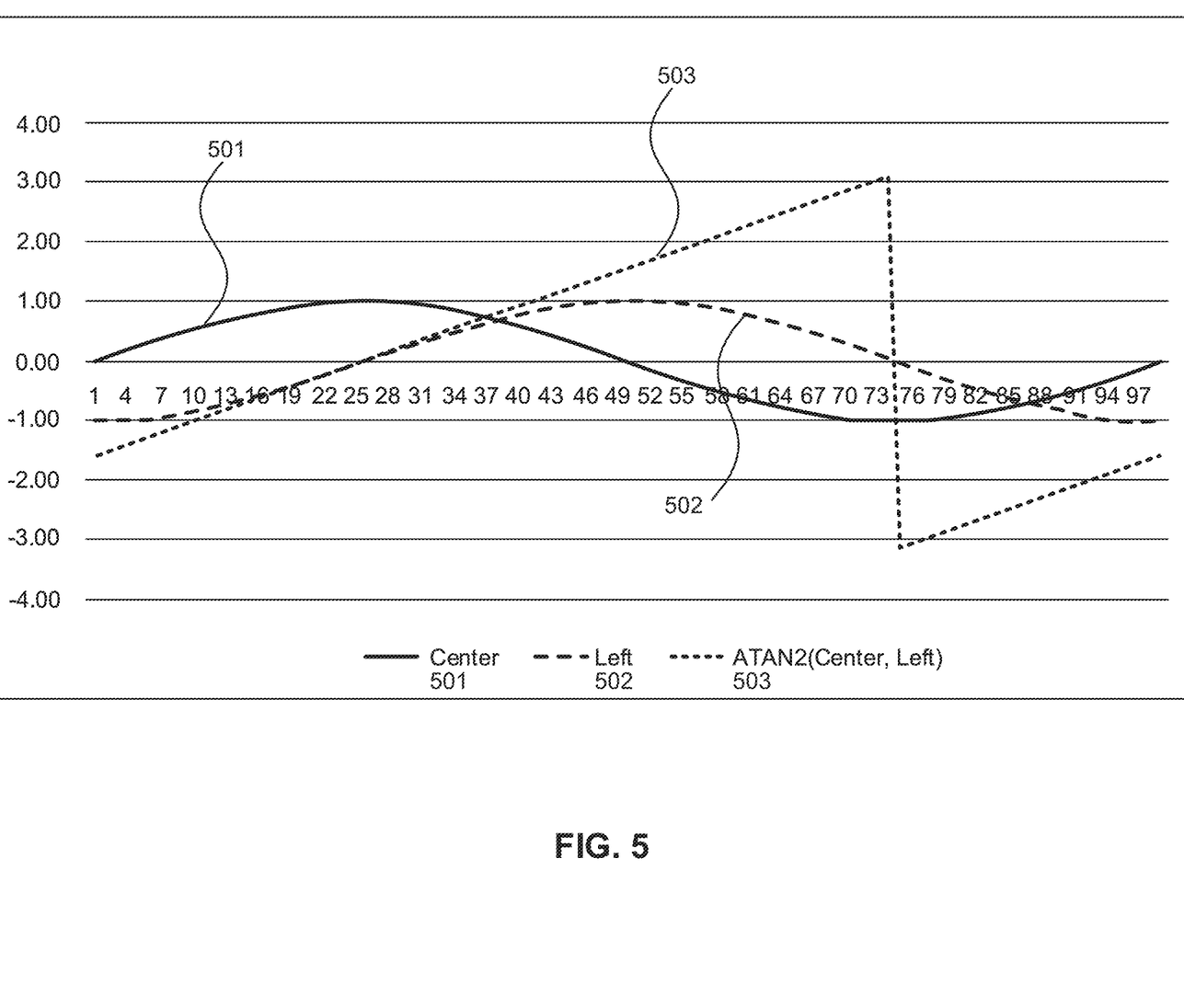
FIG. 5 shows a graph of the output of the center sensor and the left sensor of the audio-fader control of FIG. 1, and the output of ATAN 2 (center-sensor output, left-sensor output), where ATAN 2 is a known multivalued inverse tangent function with arguments (x,y).

FIG. 5 shows a graph of the output of the center sensor 501, the left sensor 502, and the output of ATAN 2 (center-sensor output, left-sensor output) 503, where ATAN 2 is a known multivalued inverse tangent function with arguments (x,y). That is, the function may be expressed as ATAN 2(x,y). The domain is the linear position of the sensing magnet 108 as it slides by the left and then center sensor. The domain may also be thought of as spanning $-\pi/2$ to $+3\pi/2$ radians for the purposes of modeling the left- and center-sensor outputs. The range of the left- and center-sensor outputs is $-1$ and $1$. The range of the ATAN 2(center-sensor output, left-sensor output) 503 is from $-\pi$ to $+\pi$. Because the left-sensor output 502 and the center-sensor output 501 are 90 degrees out of phase and sinusoidal, the outputs may be respectively modeled as left-sensor output=$\sin(\theta)$ and center-sensor output=$\cos(\theta)$. Accordingly, ATAN 2(center-sensor output, left-sensor output) 503 may be rewritten roughly as $\text{ATAN}(\sin(\theta)/\cos(\theta))=\text{ATAN}(\tan(\theta))$ over some portions of the domain. The $\text{ATAN}(\tan(\theta))$ expression may be equal to $\theta$, $\theta+\pi$, $\theta-\pi$, $+\pi/2$, or $-\pi/2$, depending on the portion of the domain. As can be seen in FIG. 5, ATAN 2(center-sensor output, left-sensor output) 503 has a constant slope across the whole domain.

Figure 6:
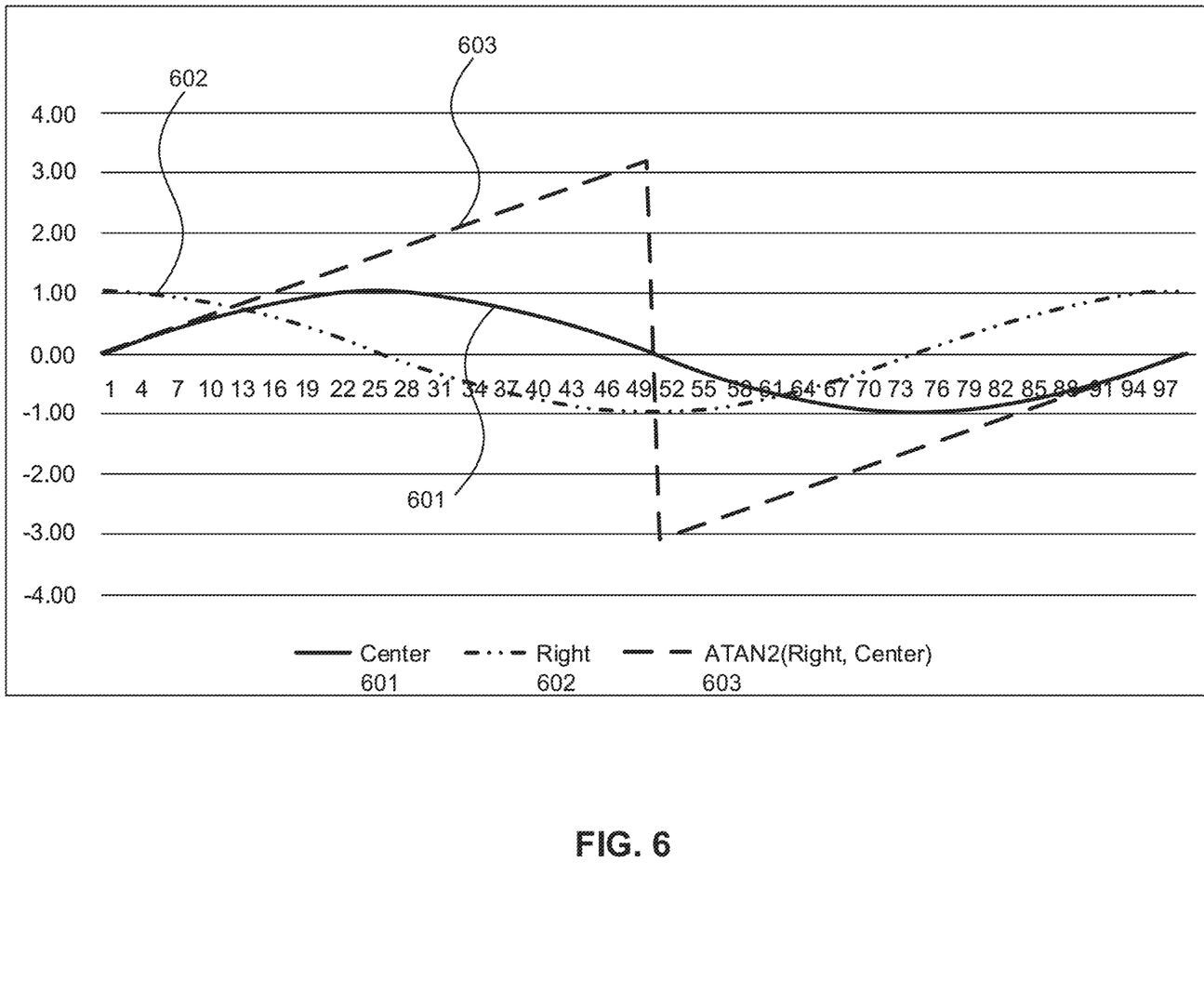
FIG. 6 shows a graph of the output of the center sensor and the right sensor of the audio-fader control of FIG. 1, and the output of ATAN 2 (right-sensor output, center-sensor output).

FIG. 6 shows a graph of the output of the center sensor 601, the right sensor 602, and the output of ATAN 2(right-sensor output, center-sensor output) 603. As in FIG. 5, the domain is the linear position of the sensing magnet 108 as it slides by the center and then right sensors. The domain may also be thought of as spanning from $0$ to $2\pi$ radians for the purposes of modeling the right-sensor output 602 and the center-sensor output 601. As in FIG. 5, the range of the right-sensor output 602 and the center-sensor output 601 is $-1$ and $1$. The range of the ATAN 2(right-sensor output, center-sensor output) 603 is from $-\pi$ to $+\pi$. Because the right-sensor output 602 and the center-sensor output 601 are 90 degrees out of phase and sinusoidal, the outputs may be respectively modeled as center-sensor output=$\sin(\theta)$ and right-sensor output=$\cos(\theta)$. Accordingly, ATAN 2(right-sensor output, center-sensor output) 603 may be rewritten roughly as $\text{ATAN}(\sin(\theta)/\cos(\theta))=\text{ATAN}(\tan(\theta))$ over some portions of the domain. The $\text{ATAN}(\tan(\theta))$ expression may be equal to $\theta$, $\theta+\pi$, $\theta-\pi$, $+\pi/2$, or $-\pi/2$, depending on the portion of the domain. As can be seen in FIG. 6, ATAN 2 (right-sensor output, center-sensor output) 603 has a constant slope across the whole domain.

Figure 7:
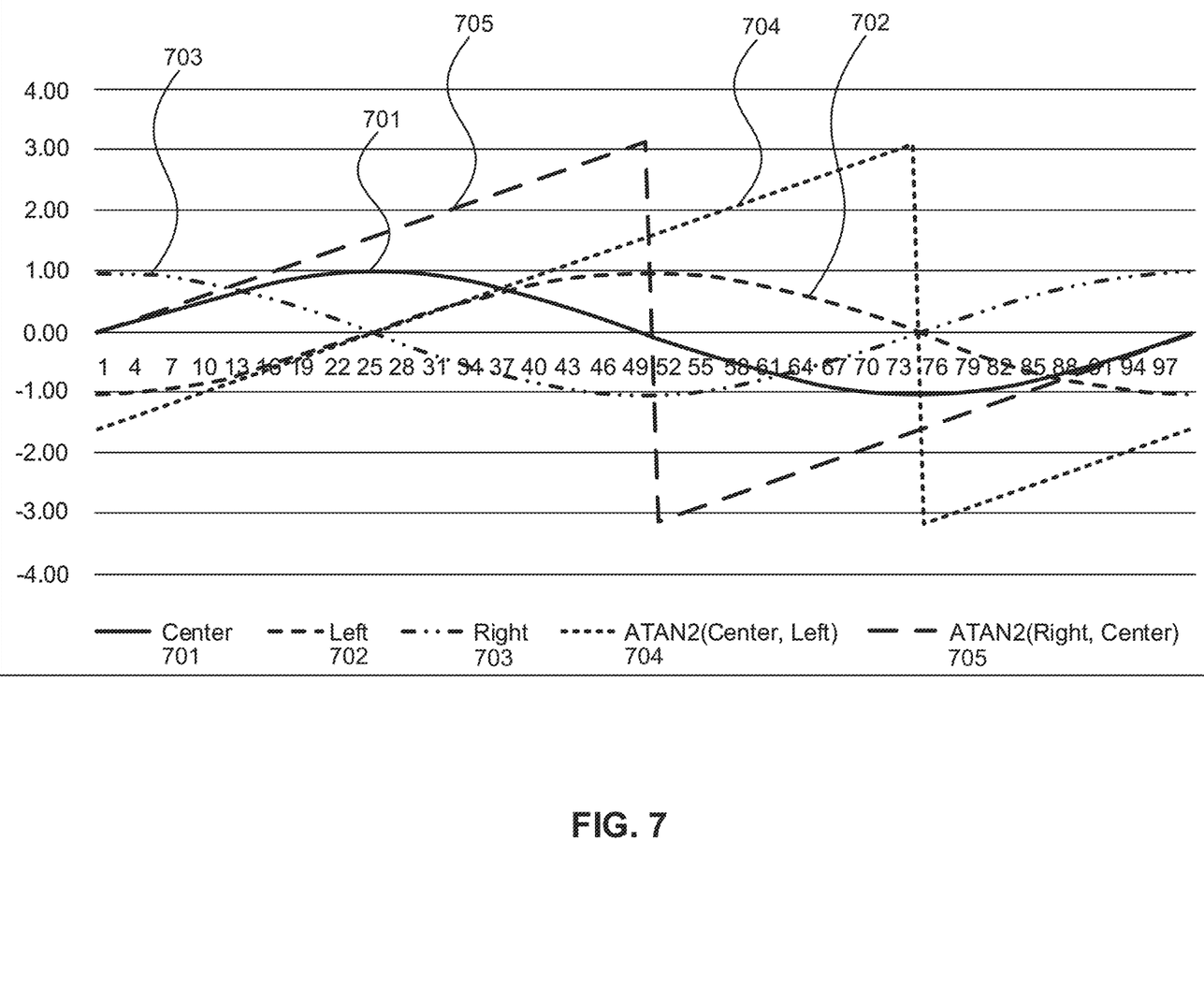
FIG. 7 shows the center-sensor output, the left-sensor output, the right-sensor output, ATAN 2 (center-sensor output, left-sensor output), and ATAN 2 (right-sensor output, center-sensor output).

FIG. 7 shows the center-sensor output 701, the left-sensor output 702, the right-sensor output 703, ATAN 2 (center-sensor output, left-sensor output) 704, and ATAN 2 (right-sensor output, center-sensor output) 705.

Figure 8:
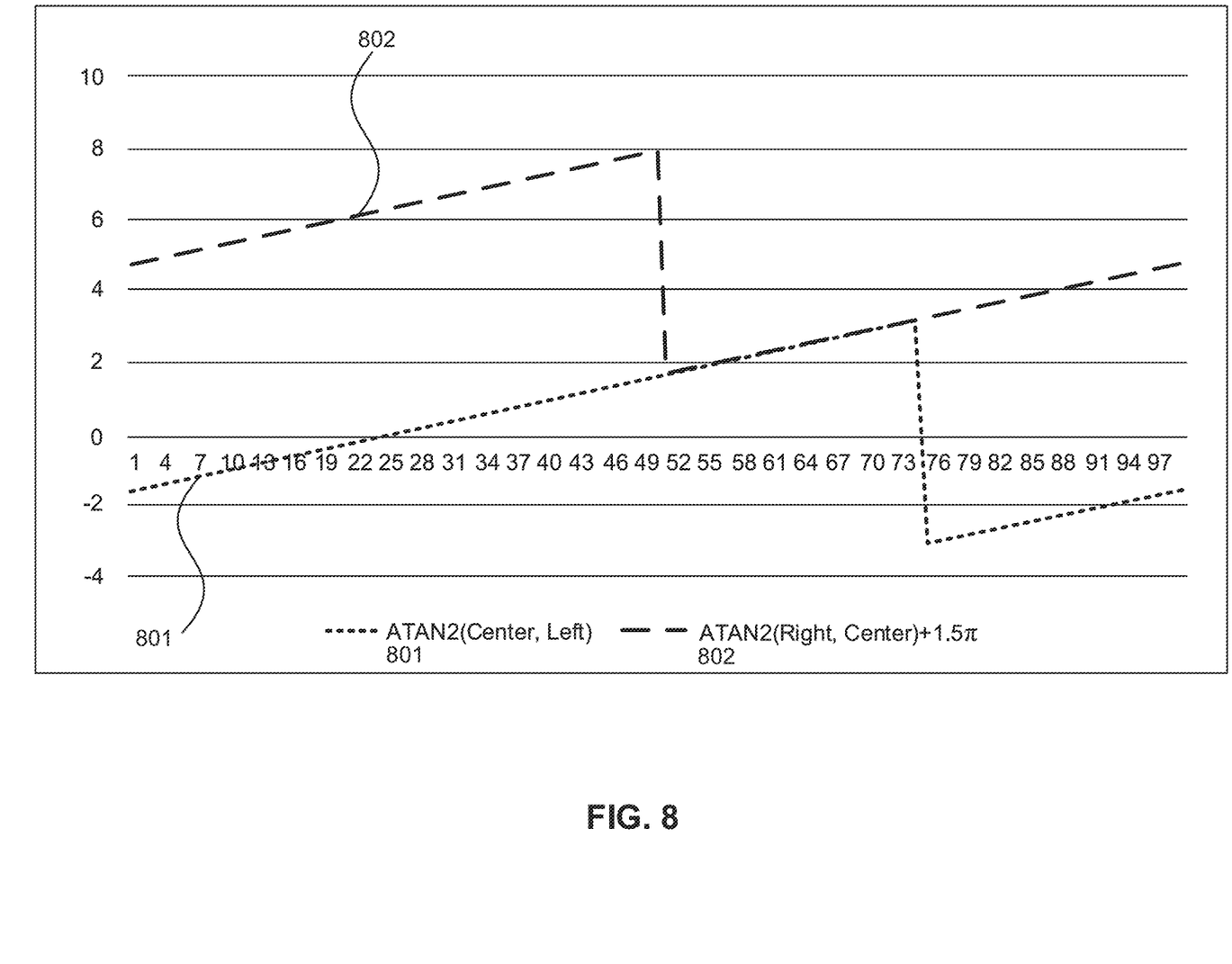
FIG. 8 shows a graph of ATAN 2 (center-sensor output, left-sensor output) and ATAN 2 (right-sensor output, center-sensor output)+1.5π.
Figure 9:
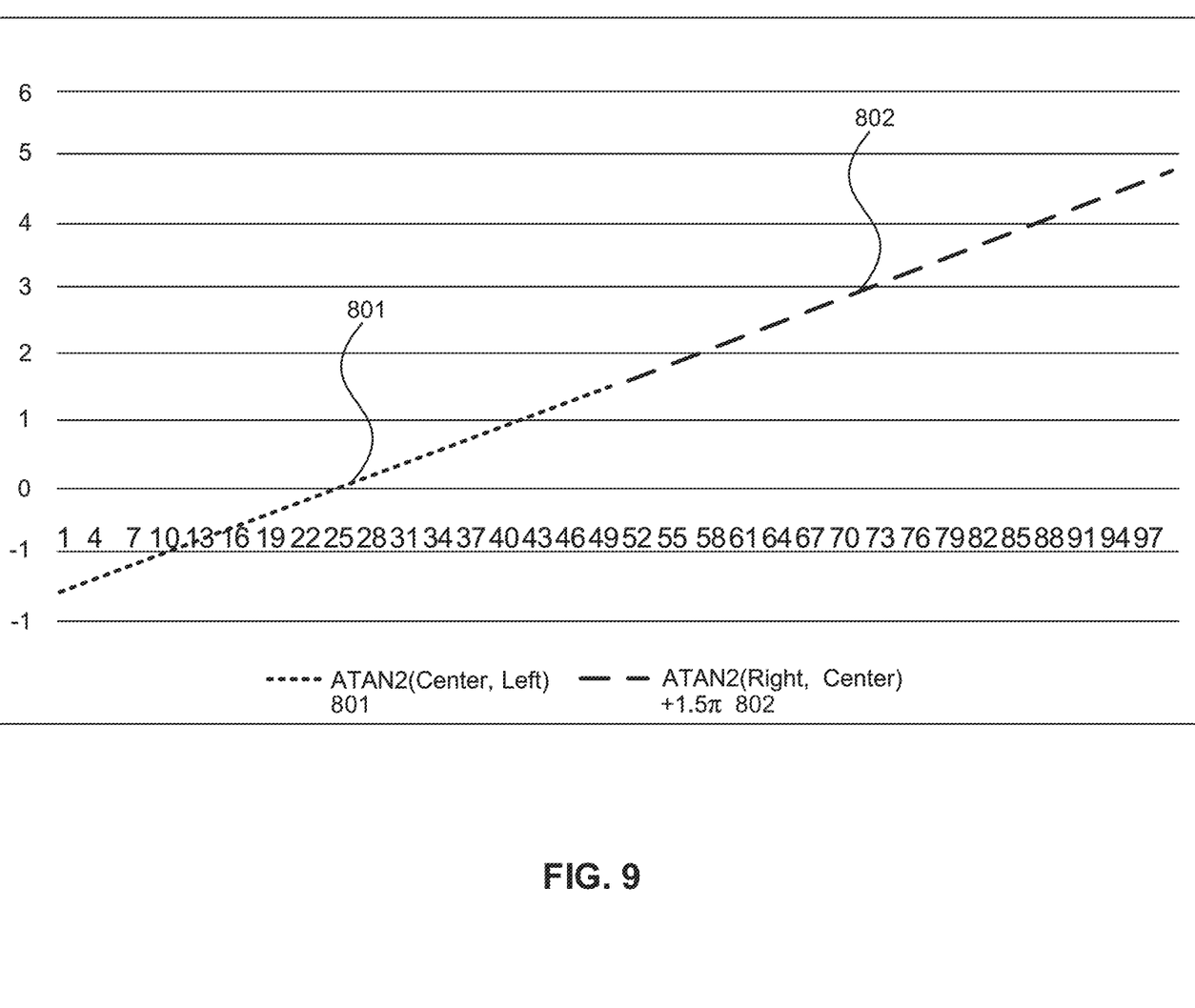
FIG. 9 shows the same plot as in FIG. 8, but with the non-linear portions of the two functions disregarded (i.e., portions of each function are combined to create a single linear function).
Figure 10:
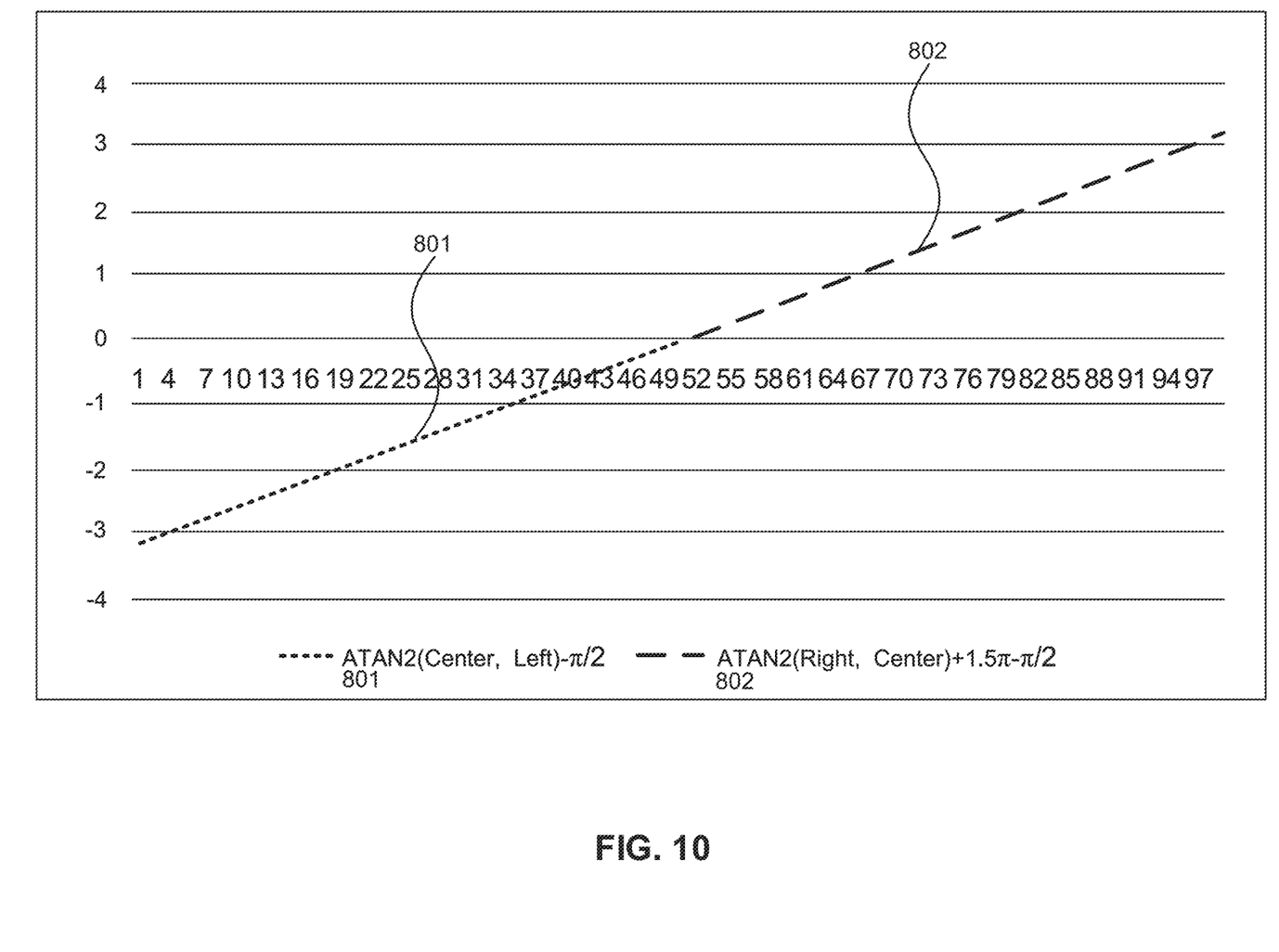
FIG. 10 shows the two functions normalized to have the center of the travel be at zero radians by subtracting π/2 from each function.

Because ATAN 2(center-sensor output, left-sensor output) 704 and ATAN 2 (right-sensor output, center-sensor output) 705 have the same slope, these functions may be manipulated to achieve a linear relationship between the position and the phase angle of the sensor outputs. FIGS. 8-10 show one exemplary method of manipulating the functions to achieve a linear relationship. FIG. 8 shows a graph of ATAN 2 (center-sensor output, left-sensor output) 801 and ATAN 2 (right-sensor output, center-sensor output)+$1.5 \pi$ 802. FIG. 9 shows the same plot as in FIG. 8, but with the non-linear portions of the two functions disregarded (i.e., portions of each function are combined to create a single linear function). FIG. 10 shows the two functions normalized to have the center of the travel be at zero radians by subtracting $\pi/2$ from each function. Thus, the outputs of the sensors have been combined to create a linear correlation between the sensing magnet position and the combined output of the sensors.

In some embodiments, the physical range over which a sensor may give a substantially sinusoidal response may be limited. Accordingly, fader 100 may use outputs from different combinations of sensors at different times. For example, the combination of sensors used may be determined by the position of the sensing magnet 108 relative to a "reference sensor." In some embodiments, this determination may comprise evaluating whether the sensing magnet 108 is to the left of the center sensor or to the right of the center sensor. If the center sensor's output is positive, the sensing magnet 108 may be determined to be to the left of the center sensor. If the center sensor's output is negative, the sensing magnet 108 may be determined to be to the right of the center sensor. In this arrangement, the center sensor may be the reference sensor. In some embodiments, another sensor may be the reference sensor in addition to or instead of the center sensor.

In an embodiment where the center sensor is the reference sensor, the left and center sensors' outputs may be used to determine the sensing magnet's 108 position when the sensing magnet 108 is left of the center sensor. The right and center sensors' outputs may be used to determine the sensing magnet's 108 position when the sensing magnet 108 is right of the center sensor.

In some embodiments, if the center sensor's output is negative, the sensing magnet 108 may be determined to be to the right of the center sensor instead of to its left. In such embodiment, if the center sensor's output is positive, the sensing magnet 108 may be determined to be to the left of the center sensor.

Figure 11:
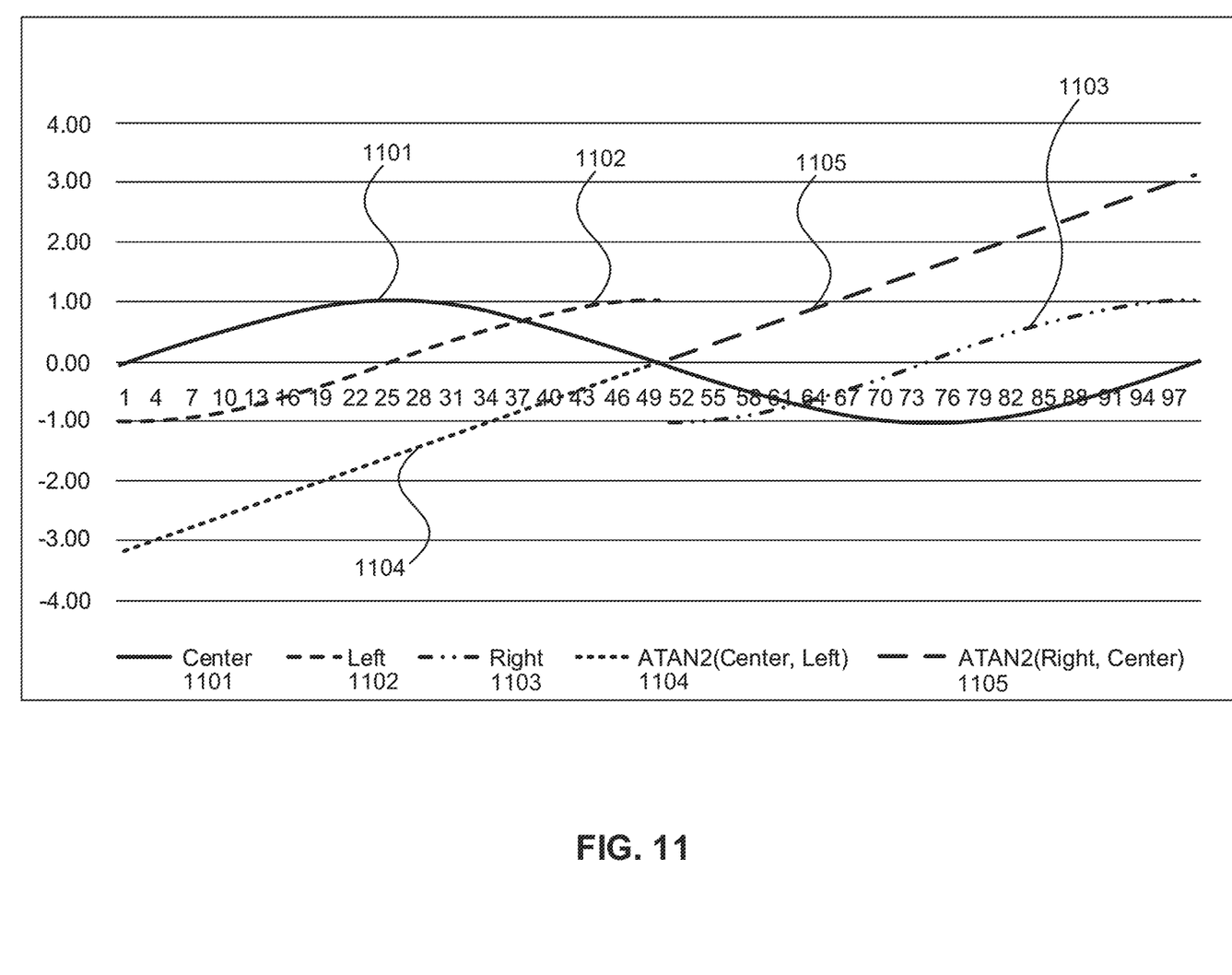
FIG. 11 shows one illustrative embodiment in which the portions of the left and center sensor outputs are used to determine the ATAN 2 (center-sensor output, left-sensor output) function when the sensing magnet is to the left of the center sensor.

FIG. 11 shows the portions of the left 1102 and center sensor outputs 1101 used in an embodiment to determine the ATAN 2 (center-sensor output, left-sensor output) function 1104 when the sensing magnet 108 is to the left of the center sensor. FIG. 11 also shows the portions of the right 1103 and center sensor outputs 1101 used to determine the ATAN 2 (right-sensor output, center-sensor output) function 1105 when the sensing magnet 108 is to the right of the center sensor. The ATAN 2 (center-sensor output, left-sensor output) function 1104 may be used to determine the sensing magnet's 108 position when it is left of the center sensor. The ATAN 2 (right-sensor output, center-sensor output) function 1105 may be used to determine the sensing magnet's 108 position when it is right of the center sensor.

It is to be understood that more than three sensors may be used. Additional sensors may be placed between the left and right sensors. Additional sensors may be placed to the left of the left sensor and/or to the right of the right sensor. The phase relationship of the output of these additional sensors to the output of other sensors (e.g., adjacent sensors and/or the center sensor) may be determined to calculate the position of the sensing magnet 108 based on the sensors' outputs. Using additional sensors may extend the physical range over which the sensing magnet's 108 position may be measured and/or increase the accuracy of the measurement.

In other embodiments, rather than a linear correlation, another type of correlation may be used. For example, there may be an exponential or logarithmic correlation. Such and other correlations may serve a similar function if they minimize the number of same sensor outputs that can be generated by more than one position. Otherwise, the sensor magnet's 108 position may be ambiguous or undeterminable from the sensor outputs.

Figure 12:
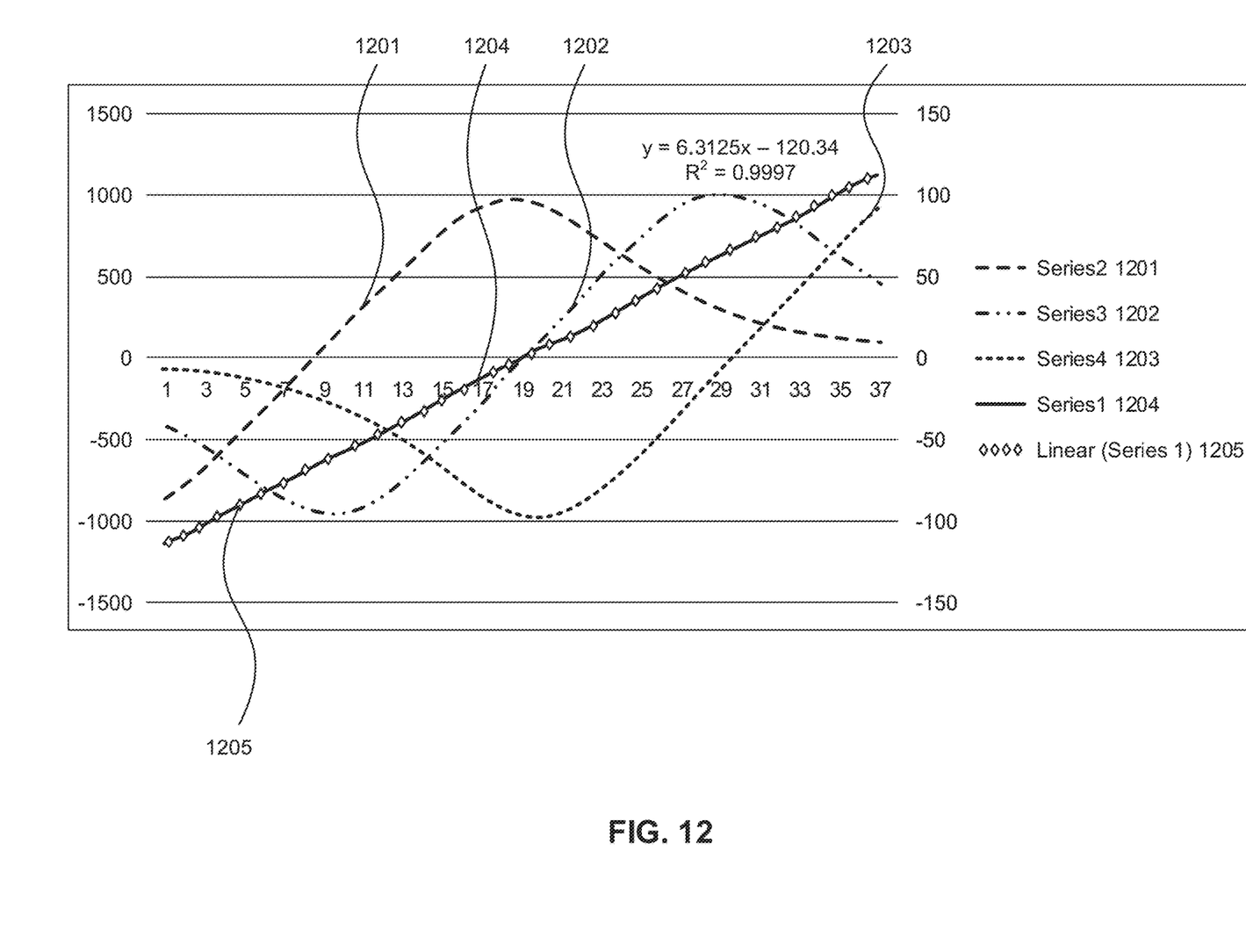
FIG. 12 shows a graph of three sensor outputs (Series 2-4) and the generated linear correlation Series 1.

In further embodiments, the output of the sensors may not be perfectly sinusoidal during the sensing magnet's slide by. FIG. 12 shows a graph of three sensor outputs 1201, 1202, and 1203 (Series 2-4) and the generated linear correlation Series 1 1204. In this case, using a pitch between sensors whereby they have about a 90 degrees phase shift may generate a non-linear correlation. The linearity of the correlation may be improved by spacing the sensors with deviations from the positions dictated by the requirement that the outputs of adjacent sensors be 90 degrees out of phase. For example, the left sensor may be moved about 0.5 mm to the left and the right censor may be moved about 0.5 mm to the right.

Fader 100 may output a signal or data to indicate the position of the carrier 106 to a host system (e.g., a processor on a mixer). This fader output signal or data may be communicated over, for example, Serial Peripheral Interface bus, I$^2$C, or other protocol. In other embodiments, the output signal or data may be communicated wirelessly.

Figure 1:
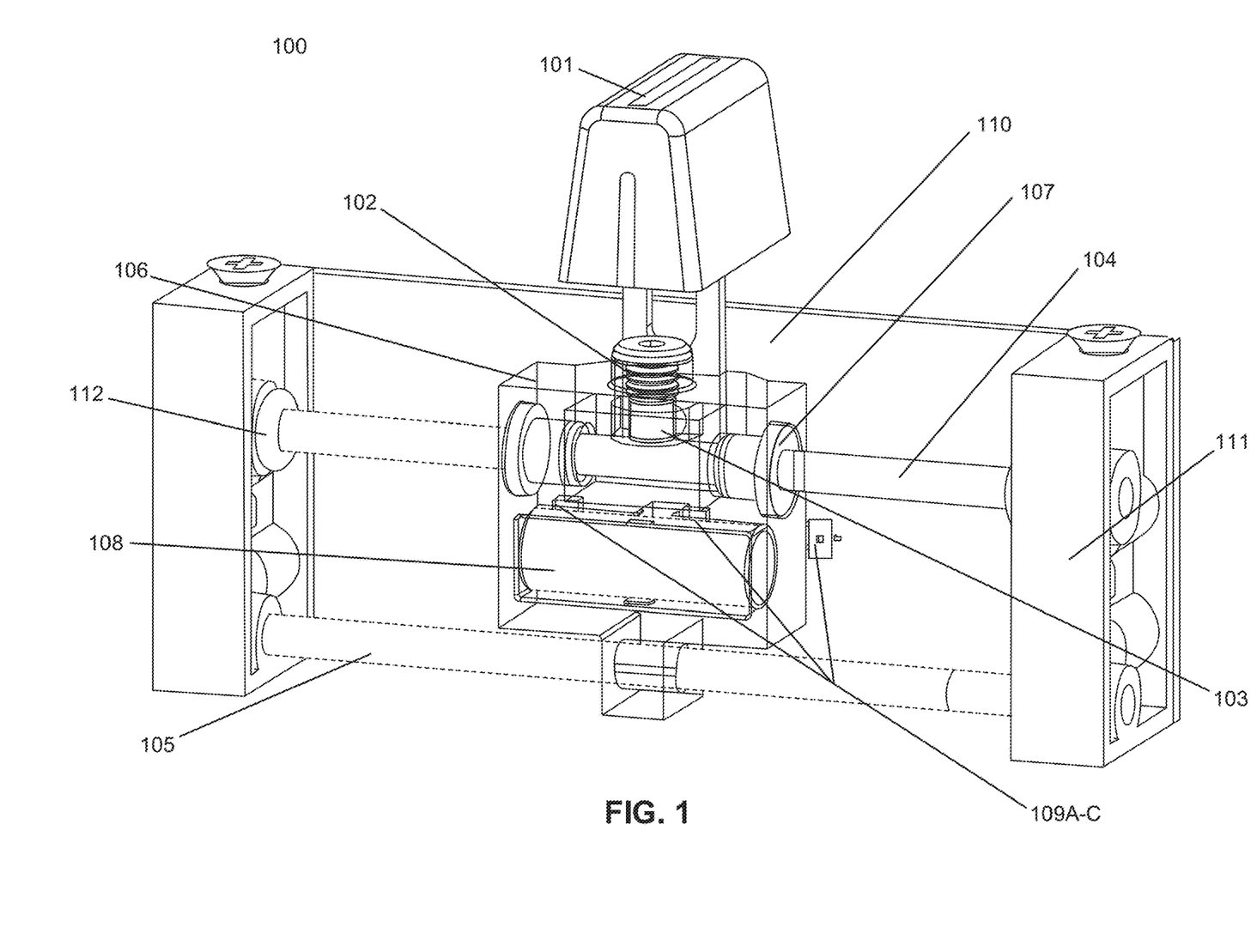
FIG. 1 shows an illustrative embodiment of an audio-fader control, consistent with the present invention.
Figure 2:
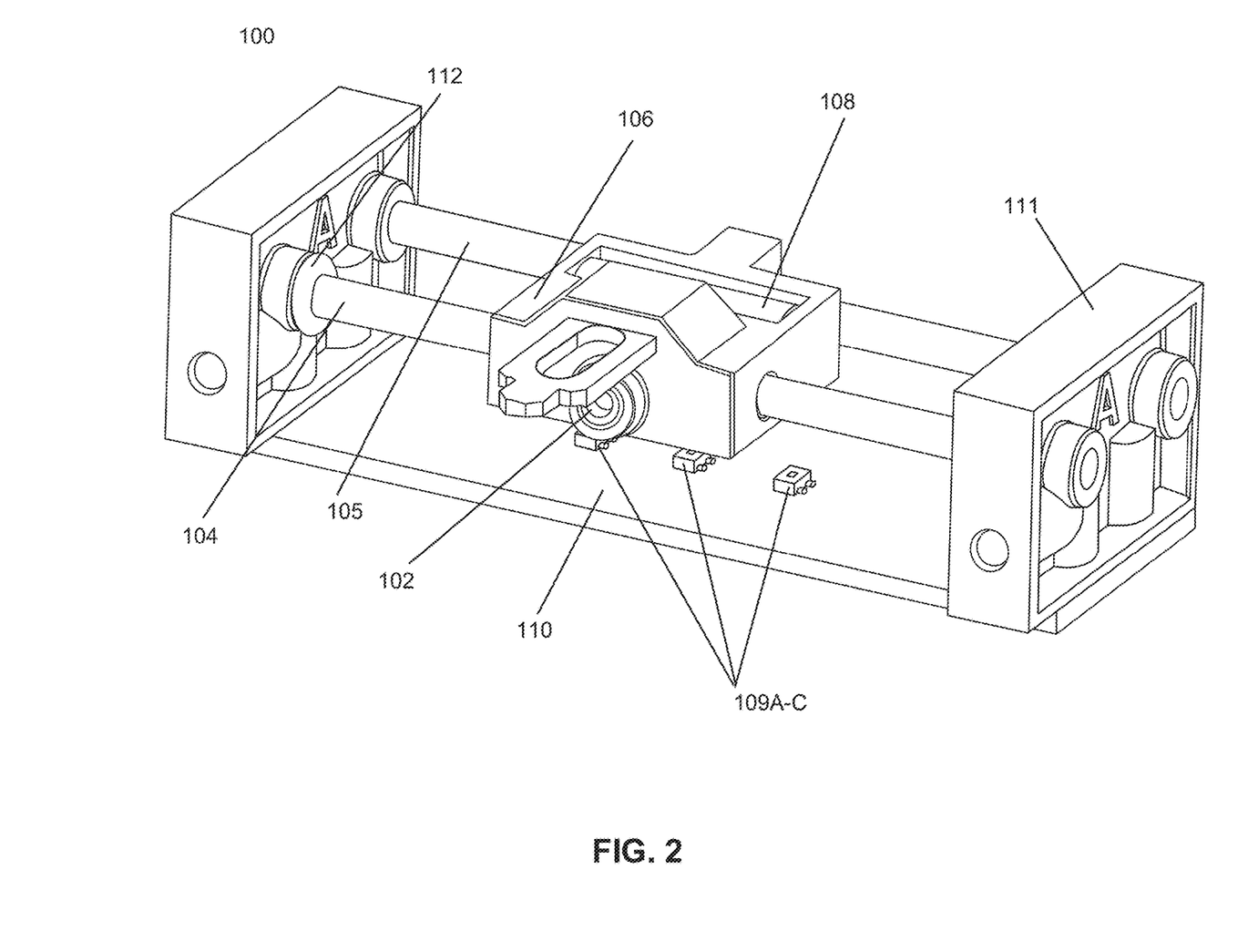
FIG. 2 shows a perspective view of internal components of the audio-fader control of FIG. 1.
Figure 13:
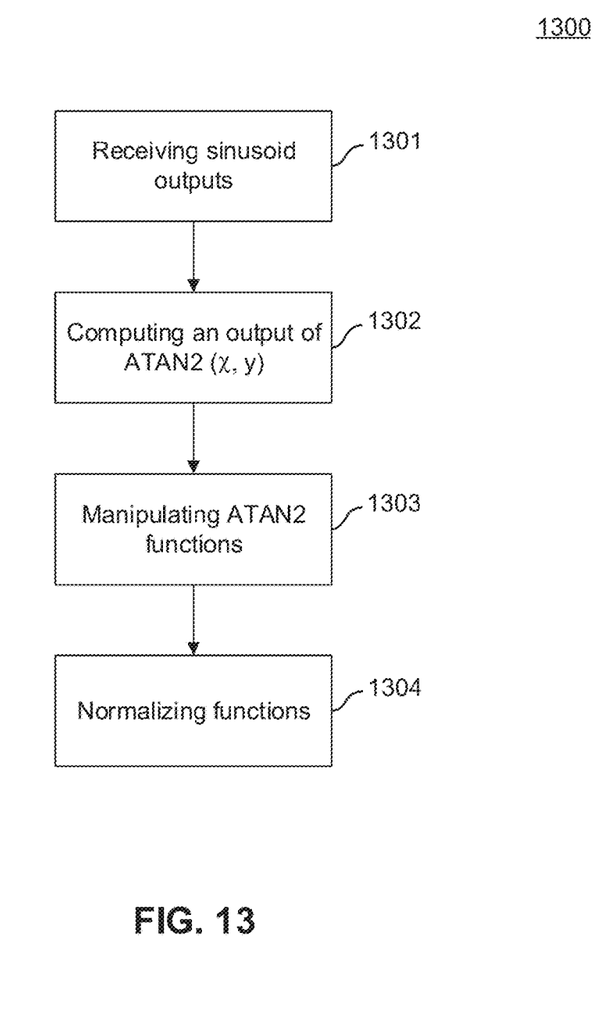
FIG. 13 is an exemplary flow chart of process for achieving a linear correlation by manipulating the sinusoid outputs received from the sensors.

FIG. 13 is an exemplary flow chart of process for achieving a linear correlation from received sinusoid outputs by manipulations in FIGS. 5-10. In step 1301, PC Board 110 may receive sinusoid outputs from magnetic flux sensors 109A-C as shown in FIG. 1. The sinusoid outputs range from −1 to 1 as described in FIG. 5.

In step 1302, the process may compute an output of ATAN 2(x,y) with the received sinusoid outputs from step 1301. In some embodiments, x may equal to center-sensor output and y may equal to left-sensor output as described in FIG. 5. In another embodiment, x may equal to right-sensor output and y may equal to center-sensor output as described with reference to FIG. 6.

In step 1303, the process manipulates the ATAN 2 functions from step 1302 to achieve a linear relationship between the position and the phase of the sensor outputs as described in FIGS. 8-10. For example, the process may manipulate ATAN 2 functions by following methods. First, the process may add 1.5 π to ATAN 2 (right-sensor output, center-sensor output) as depicted in FIG. 8. Second, the process may disregard non-linear portions of the two ATAN 2 functions, ATAN 2 (center-sensor output, left-sensor output) and ATAN 2 (right-censor output, center-sensor output), and combine rest of portions from each function to create a single linear function depicted in FIG. 9.

In step 1304, the process may normalize the manipulated function from step 1303 to have the center of the travel be at zero radians by subtracting π/2 from the manipulated function as depicted in FIG. 10. As a result, the outputs of the magnetic flux sensors 109A-C may be combined to create a linear correlation between the sensing magnet 108 position and the combined output of the sensors 109A-C.

While certain illustrative embodiments of an exemplary frictionless audio-fader position measuring system have been presented, it is to be understood that similar systems and methods known to one having ordinary skill in the art may be used to effectuate a frictionless fader position measuring system for non-audio faders.

Certain embodiments of the present disclosure can be implemented as software on a general-purpose computer or on another device.

The foregoing description has been presented for purposes of illustration. It is not exhaustive and is not limited to the precise forms or embodiments disclosed. Modifications and adaptations will be apparent to those skilled in the art from consideration of the specification and practice of the disclosed embodiments.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Words such as "and" or "or" mean "and/or" unless specifically directed otherwise. Further, since numerous modifications and variations will readily occur from studying the present disclosure, it is not desired to limit the disclosure to the exact construction and operation illustrated and described, and, accordingly, all suitable modifications and equivalents falling within the scope of the disclosure may be resorted to.

Computer programs, program modules, and code based on the written description of this specification, such as those used by the microcontrollers, are readily within the purview of a software developer. The computer programs, program modules, or code can be created using a variety of programming techniques. For example, they can be designed in or by means of Java, C, C++, assembly language, or any such programming languages. One or more of such programs, modules, or code can be integrated into a device system or existing communications software. The programs, modules, or code can also be implemented or replicated as firmware or circuit logic.

Another aspect of the disclosure is directed to a non-transitory computer-readable medium storing instructions which, when executed, cause one or more processors to perform the methods of the disclosure. The computer-readable medium may include volatile or non-volatile, magnetic, semiconductor, tape, optical, removable, non-removable, or other types of computer-readable medium or computer-readable storage devices. For example, the computer-readable medium may be the storage unit or the memory module having the computer instructions stored thereon, as disclosed. In some embodiments, the computer-readable medium may be a disc or a flash drive having the computer instructions stored thereon.

Moreover, while illustrative embodiments have been described herein, the scope of any and all embodiments include equivalent elements, modifications, omissions, combinations (e.g., of aspects across various embodiments), adaptations and/or alterations as would be appreciated by those skilled in the art based on the present disclosure. The limitations in the claims are to be interpreted broadly based on the language employed in the claims and not limited to examples described in the present specification or during the prosecution of the application. The examples are to be construed as non-exclusive. Furthermore, the steps of the disclosed methods may be modified in any manner, including by reordering steps and/or inserting or deleting steps. It is intended, therefore, that the specification and examples be considered as illustrative only, with a true scope and spirit being indicated by the following claims and their full scope of equivalents.

What is claimed is:

1. A frictionless audio-fader position measuring apparatus, comprising:
   a control slider;
   a carrier coupled to the control slider;
   a sensing magnet coupled to the carrier such that movement of the control slider causes the carrier and sensing magnet to move;

at least two magnetic flux sensors configured to output at least one of a voltage or a current based on the position of the sensing magnet; and a processor, wherein the processor calculates a correlation between the position of the sensing magnet and a phase angle between the outputs of at least two of the magnetic flux sensors to determine a position of the control slider, wherein the determined position of the slider is used to control an audio level.

2. The system of claim 1, further comprising a drag force adjustment element.

3. The system of claim 2, further comprising a drag magnet, wherein the drag force adjustment element moves the drag magnet.

4. The system of claim 2, wherein the drag force adjustment element adjusts a drag of the fader.

5. The system of claim 2, further comprising:
a main shaft;
a secondary shaft;
a plastic alloy coupled to the carrier; and
one or more bearing inserts coupled to the carrier such that the bearing inserts decrease friction between the carrier and the main shaft, and
wherein the carrier is slidably mounted on the elongated, parallel, and laterally spaced apart main shaft and secondary shaft.

6. The system of claim 5, wherein the bearing inserts are disposed within or outside the carrier.

7. The system of claim 5, wherein the main shaft and secondary shaft have a bright-mirror finish to decrease friction between the main shaft and the bearing inserts.

8. The system of claim 5, wherein the bearing inserts provide a tighter fit between the carrier and the main shaft.

9. The system of claim 1, wherein at least two magnetic flux sensors are spaced equidistantly from one another.

10. The system of claim 1, wherein the method further comprises setting a cut-in position by moving the control slider to a desired cut-in position and pressing a button.

11. The system of claim 10, wherein the method further comprises configuring one side of the cut-in position to silence or attenuate an audio and the other side of the cut-in position to make the audio audible based on the position of the control slider.

12. The system of claim 1, wherein the magnetic flux sensors are positioned parallel to a translation path of the sensing magnet.

13. The system of claim 12, wherein the magnetic flux sensors are positioned such that one sensor outputs a sinusoid that is 90 degrees out of phase from the sinusoid output of an adjacent sensor when the sensing magnet slides by.

14. A non-transitory computer-readable medium storing instructions to execute a method by a processor to measure a position of control slider on an audio-fader control fader, the audio control fader including a sensing magnet coupled to a carrier coupled to the control slider, the method comprising:
receiving sinusoid outputs from at least two magnetic flux sensors;
calculating a correlation between the position of the sensing magnet and a phase angle between the outputs of the magnetic flux sensors;
determining a position of the control slider; and
adjusting an audio level based on the determined position of the control slider.

15. The non-transitory computer-readable medium of claim 14, wherein the correlation is linear.

16. The non-transitory computer-readable medium of claim 15, wherein the method further comprises:
computing an output of ATAN 2 (the output from the right-side magnetic flux sensor, the output from the left-side magnetic flux sensor), wherein ATAN 2 is a known multivalued inverse tangent functions with arguments (x,y); and
manipulating ATAN 2 functions to achieve a linear relationship between the position and the phase angle of the sensor outputs.

17. The non-transitory computer-readable medium of claim 16, wherein the method further comprises normalizing ATAN 2 functions.

18. The non-transitory computer-readable medium of claim 15, wherein the method further comprises receiving sinusoid outputs from three magnetic flux sensors and the center magnetic flux sensor is a reference sensor.

19. The non-transitory computer-readable medium of claim 18, wherein the method further comprises evaluating the output of the reference sensor to determine a relative position of the sensor magnet from the reference sensor.

20. The non-transitory computer-readable medium of claim 14, wherein the correlation is exponential or logarithmic.

* * * * *